(12) United States Patent  (10) Patent No.: US 9,435,864 B2
Gao et al.  (45) Date of Patent: Sep. 6, 2016

(54) APPARATUS FOR MEASURING EXCITATION PARAMETERS OF INDUCTION MOTOR AND METHOD THEREOF

(75) Inventors: Zhiguang Gao, Shanghai (CN); Cheng Lu, Shanghai (CN); Jianping Ying, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 1101 days.

(21) Appl. No.: 13/540,077

(22) Filed: Jul. 2, 2012

(65) Prior Publication Data

US 2013/0096865 A1  Apr. 18, 2013

(30) Foreign Application Priority Data

Oct. 18, 2011  (CN) .......................... 2011 1 0317304

(51) Int. Cl.
 *G01R 31/30* (2006.01)
 *G01R 31/34* (2006.01)

(52) U.S. Cl.
 CPC ............... *G01R 31/34* (2013.01); *G01R 31/30* (2013.01); *G01R 31/343* (2013.01)

(58) Field of Classification Search
 CPC ................. G01R 31/30; G01R 31/34–31/343
 See application file for complete search history.

(56) References Cited

U.S. PATENT DOCUMENTS 4,039,914 A * 8/1977 Steigerwald ............ H02P 23/08
 318/375
4,926,105 A * 5/1990 Mischenko ............ H02P 21/06
 318/800
5,883,344 A 3/1999 Colby et al.
2009/0284211 A1* 11/2009 Gao ........................ H02P 23/14
 318/727

FOREIGN PATENT DOCUMENTS

| CN | 201369697 Y | 12/2009 |
|---|---|---|
| CN | 101944877 A | 1/2011 |
| JP | 2005247574 A | 9/2005 |
| TW | 200521461 A | 7/2005 |
| TW | 200713790 A | 4/2007 |
| TW | 200839275 A | 10/2008 |
| TW | 200935716 A | 8/2009 |

OTHER PUBLICATIONS

"First Office Action" issued by the State Intellectual Property Office of the People's Republic of China on Sep. 30, 2014, China.
"First Office Action" issued by the Intellectual Property Office, Ministry of Economic Affairs, R.O.C. dated Jul. 22, 2014, Taiwan.

\* cited by examiner

*Primary Examiner* — Mischita Henson
(74) *Attorney, Agent, or Firm* — Yunling Ren; Eaton & Van Winkle

(57) ABSTRACT

The present invention relates to the technical field of motor control, and discloses an apparatus for measuring excitation parameters of an induction motor and a method thereof. The method comprises: maintaining the induction motor static, and inputting a test current to a test phase of the induction motor; and calculating, based on a voltage of the test phase of the induction motor, a stator flux linkage of the test phase of the induction motor corresponding to a magnitude of the test current. The disclosure can conveniently and accurately measure excitation parameters of the induction motor.

27 Claims, 8 Drawing Sheets

[-T T]: integration time

APPARATUS FOR MEASURING EXCITATION PARAMETERS OF INDUCTION MOTOR AND METHOD THEREOF

CROSS REFERENCE TO RELATED APPLICATIONS

This application claims priority to the Chinese patent application No. 201110317304.7, filed on Oct. 18, 2011, which is incorporated herein by reference in its entirety.

TECHNICAL FIELD

The present application relates to the technical field of motor control, and particularly to an apparatus for measuring excitation parameters of an induction motor and a method thereof.

BACKGROUND ART

As shown in FIG. 1, an induction motor (I) is generally illustrated by a typical T type steady-state equivalent circuit, wherein: $R_s$ represents a stator resistance, $R_r$ represents a rotor resistance, $L_{\sigma s}$ represents a leakage inductance of the stator winding, $L_{\sigma r}$ represents a leakage inductance of the rotor winding, $L_m$ represents an excitation inductance, s represents a slip, self-inductance of stator winding $L_s = L_m + L_{\sigma s}$, self-inductance of rotor winding $L_r = L_m + L_{\sigma r}$, $U_s$ represents a phase voltage, $I_s$ represents a phase current, and $I_m$ represents an excitation current.

In practice, an induction motor (as a controlled object) achieves a high performance vector control of the rotor flux linkage orientation by a power converter, and generally adopts a T-II type steady-state equivalent circuit, as shown in FIG. 2, wherein: $R_s$, $R_r$, s, $U_s$ and $I_s$ have the same meanings as described above, thus, no further details thereof will be given; $L_\sigma$ represents a total leakage inductance; $L'_m$ represents an excitation inductance; $I'_m$ represents an excitation current.

While the T type and T-II type steady-state equivalent circuits are totally equivalent to each other, the T-II type steady-state equivalent circuit is constructed with a constant total rotor flux linkage. A relationship between the two types of steady-state equivalent circuits is:

$$\text{Maintaining } R_s \text{ constant; } L_\sigma = \left(1 - \frac{L_m^2}{L_s L_r}\right) \cdot L_s;$$

$$L'_m = \frac{L_m^2}{L_r}; \quad R'_r = \left(\frac{L_m}{L_r}\right)^2 \cdot R_r$$

The T-II type steady-state equivalent circuit will be expressly illustrated below. For simplicity, the stator resistance, the rotor resistance, the total leakage inductance, the excitation inductance, and the excitation current in induction motor parameters of the equivalent circuit are respectively represented by $R_s$, $R_r$, $L_\sigma$, $L_m$, $I_m$, as shown in FIG. 3.

Among the aforesaid parameters, the stator resistance $R_s$, the total leakage inductance $L_\sigma$ and the rotor resistance $R_r$ can be measured when the induction motor is at standstill. The excitation parameters (i.e., the excitation current $I_m$, the excitation inductance $L_m$) of the induction motor can be measured only when the induction motor is under no-load rotary test. The principle of the no-load test is as follows: when a shaft end of the induction motor is disconnected from any load, the induction motor rotates approximately at a synchronous speed, the slip s≈0, and an impedance of a rotor circuit is infinite such that the rotor circuit can be regarded as an open circuit. And then the induction motor shown in FIG. 3 may be converted into an equivalent circuit shown in FIG. 4. A three-phase symmetric alternating voltage $U_s$ with a specific frequency f is input into the equivalent circuit, wherein the three-phase alternating voltage $U_s$ corresponds to the phase current $I_s$. At this time, the input phase current $I_s$ is totally used for excitation, that is, $I_s \approx I_m$. A reactive power Q of the induction motor can be calculated by using a sample current $I_s$ and a voltage signal $U_s$, and the inductance of the stator winding $L_s$ of the induction motor can be calculated by an equation $L_s = Q/(2\pi f \cdot I_m^2)$, wherein the inductance of the stator winding $L_s$ contains the excitation inductance $L_m$ and the leakage inductance $L_\sigma$, and then the excitation inductance $L_m$ can be calculated by subtracting the leakage inductance $L_\sigma$ from the inductance of the stator winding $L_s$, thereby a corresponding air gap flux linkage can be calculated, i.e., $\psi_m = L_m \cdot I_m$.

Due to a saturation effect, the excitation inductance $L_m$ changes with the air gap flux linkage $\psi_m$ varying, thereby, excitation parameters with different excitation levels can be measured, and the excitation parameters form one group of excitation curves. The principle of calculating the excitation curve is as follows: a magnitude of the air gap flux linkage $\psi_m$ depends on a voltage-frequency-ratio $U_s/f$. In the no-load test, a nominal voltage and a nominal frequency are input into the induction motor, and then nominal excitation parameters $\psi_{mN}$, $L_{mN}$ and $I_{mN}$ can be calculated through the above method. A ratio of the nominal voltage and the nominal frequency can be considered as a benchmark, the benchmark is multiplied by different coefficients, and the alternating voltages obtained with the new ratios are input into the induction motor, and then multiple groups of excitation parameters ($\psi_m$, $L_m$ and $I_m$) can be calculated, and then these calculated excitation parameters are plotted as a curve, so as to obtain a curve of excitation parameters of the induction motor.

To sum up, in prior arts, the excitation parameters can be measured only when the induction motor is under no-load rotary operation. However, in many field applications, the induction motor has been connected to a load of a mechanical apparatus (e.g., a crane or a rolling mill, etc.), and then if the no-load test is implemented when the induction motor is connected to the load of the mechanical apparatus, the accuracy of measured excitation parameters will be severely affected by the load of the mechanical apparatus. But it is inconvenient for the operator to separate the mechanical apparatus from the induction motor in actual operations. Therefore, when the induction motor is connected to the load of the mechanical apparatus, a technical solution for measuring excitation parameters of the induction motor at standstill is desirable.

SUMMARY OF THE INVENTION

The disclosure of present application provides an apparatus for measuring excitation parameters of an induction motor and a method thereof, so as, in part, to solve the prior art problem in that measuring excitation parameters of the induction motor is inconvenient and inaccurate when the induction motor is connected to the load of mechanic apparatus.

In one aspect, there is provided an apparatus for measuring one or more excitation parameters of an induction motor. The apparatus comprises:

a control unit, a power converter, and an excitation parameter calculating unit;

the power converter is for providing a test current to a test phase of the induction motor, meanwhile an output of the power converter maintains the induction motor at standstill;

the control unit is equipped with an current instruction for indicating the test current, and is for regulating the test current provided by the power converter to be equivalent to the current instruction (e.g., at least 90%, 95%, 96%, 97%, 98%, 99%, 100%, 101%, 102%, 103%, 104%, 105%, or 110% equivalent to the current instruction), and controlling the output of the power converter to maintain the induction motor static; and the excitation parameter calculating unit is for receiving a voltage signal of a test phase of the induction motor and a current signal of the test phase of the induction motor, so as to calculate the excitation parameters.

In another aspect, there is provided a method for measuring one or more excitation parameters of an induction motor. The method comprises the steps of:

maintaining the induction motor static, and inputting a test current to a test phase of the induction motor; and calculating, based on a voltage of the test phase of the induction motor, a stator flux linkage of the test phase of the induction motor corresponding to a magnitude of the test current.

The technical solutions provided in the disclosure, in part, are capable of conveniently and accurately measuring excitation parameters of the induction motor in static when the induction motor is connected to the load of the mechanic apparatus, so as to meet the requirements of actual operations.

The aforesaid and other objects, features and advantages of the disclosure will be more apparent through describing the embodiments of the present application referring to the appended drawings below.

BRIEF DESCRIPTION OF THE DRAWINGS

The embodiments of the present application will be described below referring to the appended drawings, wherein.

DETAILED DESCRIPTION OF THE EMBODIMENTS

In some embodiments, an induction motor to be measured is exemplified by a three-phase induction motor. Since the three phases of the induction motor are substantially symmetric to each other, the excitation parameters of the induction motor to be measured may be excitation parameters from any one of the three phases.

A first embodiment of the apparatus for measuring excitation parameters of the induction motor will be described below.

Figure 1:
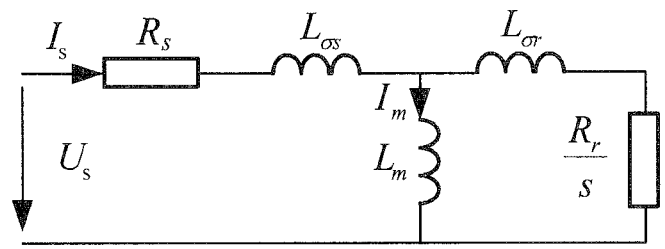
FIG. 1 is a schematic diagram of a typical T-type Steady-state equivalent circuit in the prior art.
Figure 2:
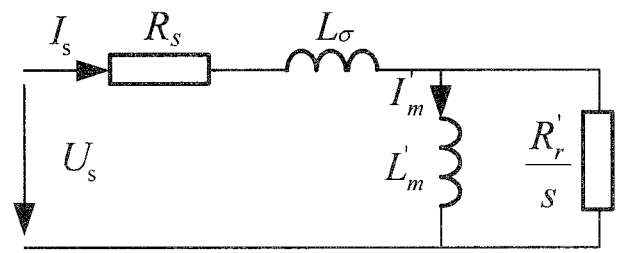
FIG. 2 is a schematic diagram of a T-II type Steady-state equivalent circuit in the prior art.
Figure 3:
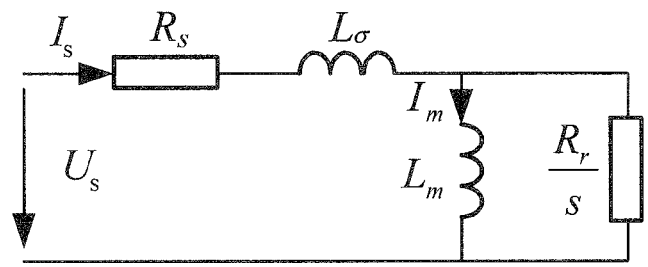
FIG. 3 is a schematic diagram of the T-II type Steady-state equivalent circuit whose physical symbols are simplified.
Figure 4:
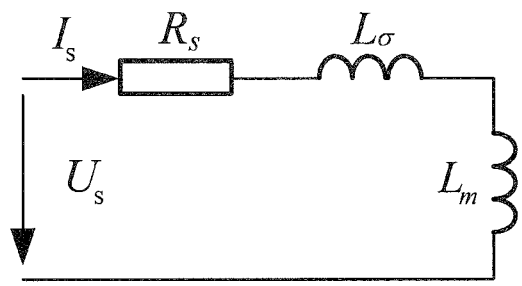
FIG. 4 is a schematic diagram of the equivalent circuit shown in FIG. 3 when the slip is zero.
Figure 5:
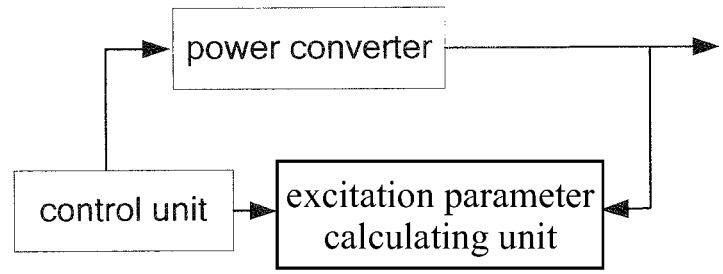
FIG. 5 is a schematic diagram exemplifying a measuring apparatus for measuring excitation parameters of an induction motor according to some aspects.

In a case when the induction motor is connected to a load of mechanical apparatus, in order to measure excitation parameters of the induction motor in static, the present embodiment provides an apparatus for measuring excitation parameters of the induction motor, as shown in FIG. 5, the apparatus comprising a power converter, a control unit, and an excitation parameter calculating unit.

The power converter is configured to provide a test current to a test phase of the induction motor, and an output of the power converter maintains the induction motor static. Maintaining the induction motor static can be accomplished in various ways, but not limited to the following illustrated ways. The first way: a test current or a test phase voltage provided by the power converter to the test phase of the induction motor respectively equals a sum of magnitudes of currents or a sum of magnitudes of voltages provided to another two non-test phases of the induction motor, and a direction of the test current or the test phase voltage is respectively reverse to the direction of the current or the voltage provided to the two non-test phases. The second way: the test current (or the test phase voltage) provided by the power converter to the test phase of the induction motor respectively equals a magnitude of a current (or a magnitude of a voltage) provided to one non-test phase of the induction motor, and the direction of the test current (or the test phase voltage) is reverse to the direction of the current (or the voltage) provided to said one non-test phase, and another non-test phase of the induction motor is electrically disconnected from the power converter or neither current nor voltage is provided by the power converter to said another non-test phase of the induction motor. Providing neither current nor voltage to said another non-test phase of the induction motor, for example, is accomplished by turning off a power device in a bridge arm arranged between the power converter and said another non-test phase so as to prevent the current from flowing to it.

The control unit is equipped with a current instruction for indicating the test current, and the control unit is for regulating the test current provided by the power converter to be equivalent to the current instruction (e.g., at least 90%, 95%, 96%, 97%, 98%, 99%, 100%, 101%, 102%, 103%, 104%, 105%, or 110% equivalent to the current instruction), and controlling an output of the power converter to maintain the induction motor static.

The excitation parameter calculating unit is for calculating excitation parameters upon receipt of a current signal of the test current or a voltage signal of the test phase of the induction motor. The excitation parameter calculating unit is particularly configured to calculate, based on the voltage signal of the test phase of the induction motor, a stator flux linkage of the test phase of the induction motor corresponding to the magnitude of the test current for every periodic current, so as to obtain one group of stator flux linkage or multiple groups of stator flux linkage corresponding to different excitation levels; and calculate, based on the magnitude of the test current and the stator flux linkage corresponding to the magnitude of the test current, one group of air gap flux linkage of the test phase of the induction motor. Thus, in view of the above, the excitation parameter calculating unit needs to obtain a current value and a direction of the test current of the test phase, and a voltage value and a direction of the test phase voltage. In an actual measuring apparatus, the current signal of the test current received by the excitation parameter calculating unit may come from the current instruction of the control unit, or come from a sample signal of the test current of the induction motor. Similarly, the voltage signal of the test phase voltage of the induction motor received by the excitation parameter calculating unit may come from a voltage instruction converted by the control unit from the current instruction, or come from a sample signal of the test phase voltage of the induction motor. Theoretically, in order to more accurately measure excitation parameters of the induction motor, the current signal of the test current and the voltage signal of the test phase voltage of the induction motor to be obtained by the excitation parameter calculating unit may both come from real-time sample signals of the test phase of the induction motor, which will facilitate to increase accuracy of measuring excitation parameters of the induction motor, but will complicate the actual measuring apparatus and increase difficulties of actual operation. In order to balance the measuring accuracy and the simplicity for the measuring apparatus, the current signal of the test current or the voltage signal of the test phase voltage of the induction motor received by the excitation parameter calculating unit generally come from the control unit.

Figure 6:
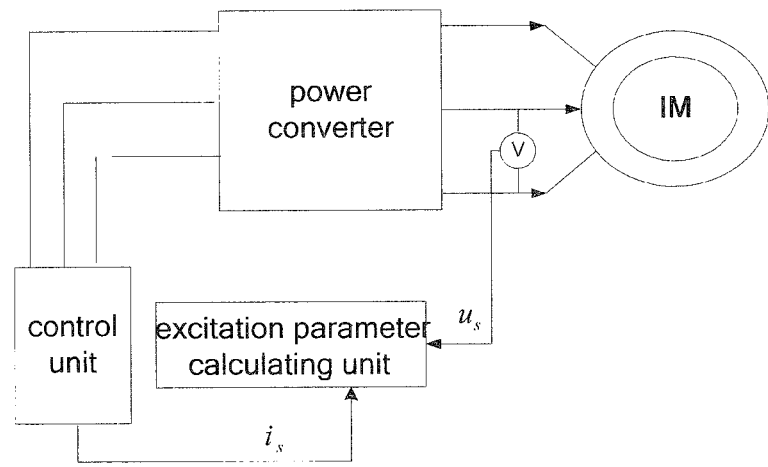
FIG. 6 is a frame chart exemplifying a measuring apparatus for measuring excitation parameters of the induction motor according to some aspects.

FIG. 6 illustrates an exemplary frame diagram of the apparatus for measuring excitation parameters of an induction motor. As shown in FIG. 6, a current mode power converter is taken as an example of the power converter. The control unit regulates the test current provided by the power converter to the test phase to be close or equal to (that is, to be equivalent to) the current instruction preset in the control unit, and meanwhile controls the output of the power converter to maintain the induction motor static. The current signal of test current of the test phase of the induction motor received by the excitation parameter calculating unit comes from the current instruction of the control unit, and the voltage signal of the test phase voltage comes from sampling the test phase voltage of the induction motor, thereby, related excitation parameters of the test phase of the induction motor can be calculated.

To measure one group of excitation parameters, the current instruction may be a single periodic current instruction. Alternatively, to measure multiple groups of excitation parameters corresponding to different excitation levels, the current instruction may be a periodic current instruction with current magnitude varying. In order to effectively eliminate voltage errors caused either by a device voltage drop and a dead time existing in the power converter or by a resistance of the test phase, a periodic waveform of the current instruction is adapted to include a point-symmetric waveform with respect to a point in a periodic time zone. The point-symmetric waveform may comprise three waveform segments: a negative direct-current waveform segment, a positive-negative alternating waveform segment, and a positive direct-current waveform segment. Calculating the stator flux linkage corresponding to the point-symmetric waveform segment with respect to the point in the periodic time zone may eliminate the above voltage errors in the duration corresponding to the point-symmetric waveform segment. The periodic waveform of the current instruction may be a point-symmetric trapezoidal waveform with respect to a midpoint of the periodic time zone, which facilitates the control unit to control and facilitates the excitation parameter calculating unit to calculate, so as to reduce hardware requirement for the measuring apparatus. If the periodic waveform of the current instruction comprises two half-periodic waveform segments axis-symmetric to each other, and each half-periodic waveform segment is a point-symmetric waveform with respect to a midpoint of its corresponding periodic time zone, then, calculating, based on this kind of waveform of the current instruction, the stator flux linkage corresponding to the two half-periodic waveform segments, may eliminate both the measuring error caused by direct-current bias and the above voltage errors. The periodic waveform of the current instruction may be two half-periodic waveform segments axis-symmetric to each other, and each half-periodic waveform segment is a point-symmetric trapezoidal waveform with respect to a midpoint of its corresponding periodic time zone, so as to eliminate the measuring error caused by the direct-current bias while reducing hardware requirement for the control unit and the excitation parameter calculating unit in the measuring apparatus.

The apparatus for measuring excitation parameters of the induction motor according to the first embodiment is capable of conveniently and accurately measuring the excitation parameters when the induction motor is connected to the load of the mechanical apparatus, so as to satisfy requirements for actual implementations.

A second embodiment of the apparatus for measuring excitation parameters of the induction motor will be described below.

Figure 7:
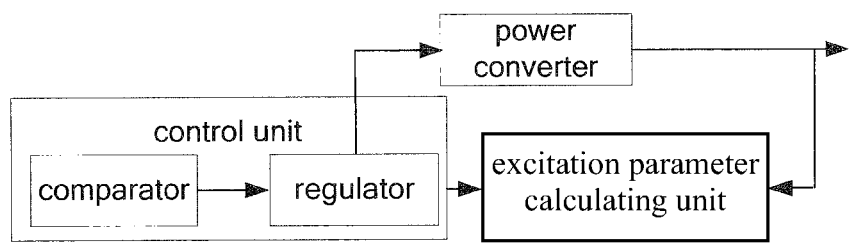
FIG. 7 is a schematic diagram exemplifying a measuring apparatus for measuring excitation parameters of the induction motor according to some aspects.

In a case when an induction motor is connected to the load of the mechanical apparatus, to measure excitation parameters of the induction motor in static, FIG. 7 shows an apparatus similar to that of FIG. 5, but modified to have a control unit comprising a comparator and a regulator.

The comparator is equipped with a current instruction indicative of the test current of the test phase of the induction motor, and is configured to receive a sample signal of the test current, and compare the sample signal with the current instruction, so as to output an error of the current signal.

The regulator is configured to receive the error of the current signal, regulate, based on the error of the current signal, the test current provided by the power converter to the test phase of the induction motor to be close or equal to the current instruction, meanwhile maintains the output of the power converter to keep the induction motor static.

Figure 8:
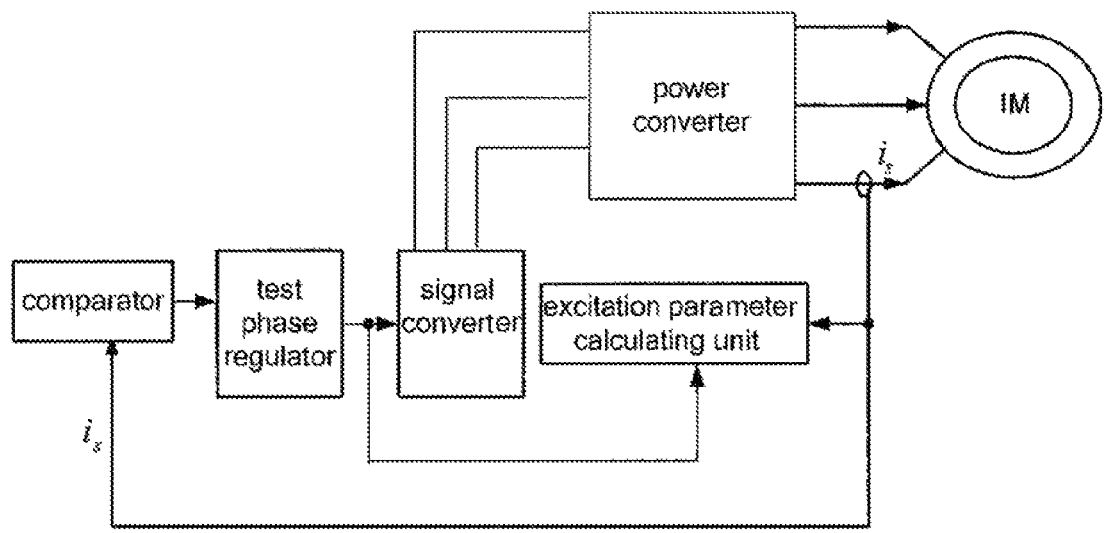
FIG. 8 is a schematic diagram exemplifying a measuring apparatus for measuring excitation parameters of the induction motor according to some aspects.

The present embodiment is illustrated by taking a voltage mode power converter as an example of the power converter, and the following description takes the first way described in the first embodiment of the measuring apparatus as an example to maintain the induction motor static. Compared with the regulator shown in FIG. 7, in order to keep the regulator to control the voltage mode power converter, the regulator in FIG. 8 comprises a test phase regulator and a signal converter.

The test phase regulator is configured to receive the error of the current signal, and regulate and output the test phase voltage instruction corresponding to the voltage mode power converter in the present embodiment.

The signal converter is configured to receive the test phase voltage instruction output by the test phase regulator, and regulate three phase voltages output by the power converter in order to make the test phase current provided to the test phase of induction motor close or equal to the test phase current instruction while the induction motor is kept static at the same time. So the signal converter need transform the other two non-test phase voltage signals based on the relationship between the test phase and non test phase of the induction motor. The relationship between them while the induction motor is kept static has already been illustrated in the first embodiment; therefore it will not be further discussed anymore. The excitation parameter calculating unit is configured to receive the test phase voltage instruction output by the test phase regulator and a sample signal from the test current of the test phase of the induction motor, and calculate excitation parameters according to the test phase voltage instruction and the sample signal of the test current in the test phase of the induction motor.

It is noted that the type of the current instruction is the same as that illustrated in the first embodiment of the measuring apparatus; hereby no more details will be given.

The apparatus for measuring excitation parameters of the induction motor according to the second embodiment is also capable of conveniently and accurately measuring the excitation parameters when the induction motor is connected to the load of the mechanical apparatus, so as to satisfy requirements for actual implementations.

In the above embodiments, the specific configuration of the power converter may correspond to that of a frequency converter which is known in this art. Each of the control unit, the excitation parameter calculating unit, the comparator, the test phase regulator and the signal converter may be implemented in one way as a DSP (Digital Signal Processor) or MCU (Micro Control Unit) which was programmed with appropriate programs. When such programs are running on the DSP or MCU, the DSP or MCU plays the role of corresponding one of the control unit, the excitation parameter calculating unit, the comparator, the test phase regulator and the signal converter.

A first embodiment of method for measuring excitation parameters of the induction motor will be described below.

The present embodiment provides a method for measuring excitation parameters of the induction motor, and the detailed procedures are as follows:

Maintaining the induction motor static and inputting a test current to a test phase of the induction motor. If only measuring one group of excitation parameters, the test current may be a single periodic test current. If measuring multiple groups of excitation parameters corresponding to different excitation levels, the test current may be a periodic test current with different magnitude for each period.

Further, the method for maintaining the induction motor static is to control the magnitudes and directions of the voltage or the current provided to the test phase and the non-test phases of the induction motor. The ways to accomplish the above method comprises two kinds of ways for maintaining the induction motor static, which are the same as the two ways described in the first embodiment of the measuring apparatus, therefore, no more details will be given.

The equivalent circuit of the induction motor may be illustrated in many forms in the present embodiment. Without loss of generality, the T-II type equivalent circuit may be used as an example to illustrate the present embodiment. However, the scope of the present application is not limited thereto. The technical scheme disclosed here is also applicable to the T type equivalent circuit or other equivalent circuits known to those skilled in the art.

Figure 9:
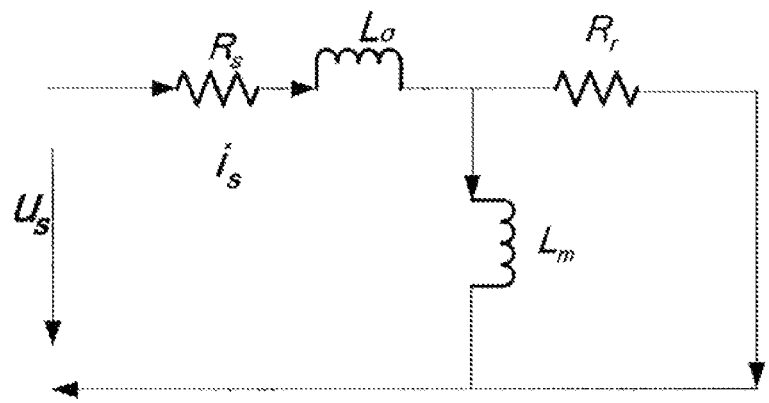
FIG. 9 is a schematic diagram exemplifying the Steady-state equivalent circuit of the induction motor in static according to some aspects.

FIG. 9 illustrates an example of the equivalent circuit of the induction motor in static state in the present embodiment. In FIG. 9, the induction motor is connected to the load of the mechanical apparatus, wherein: $R_s$ represents a stator resistance; $R_r$ represents a rotor resistance; $L_\sigma$ represents a total leakage inductance; $L_m$ represents an excitation inductance; $u_s$ represents a test phase voltage; $i_s$ represents a test current.

The present embodiment may be illustrated by measuring the excitation parameters corresponding to one single period of the test current of the induction motor when maintaining the induction motor static. When the test current $i_s$, the magnitude of which corresponds to the single period, is input into the induction motor, a variation of the stator flux linkage $\psi'_s$ is established inside the induction motor. The variation of the stator flux linkage $\psi'_s$ may be obtained by an equation (1):

$$\psi'_s = \int(u_s - R_s \cdot i_s)dt \quad (1)$$

Figure 10:
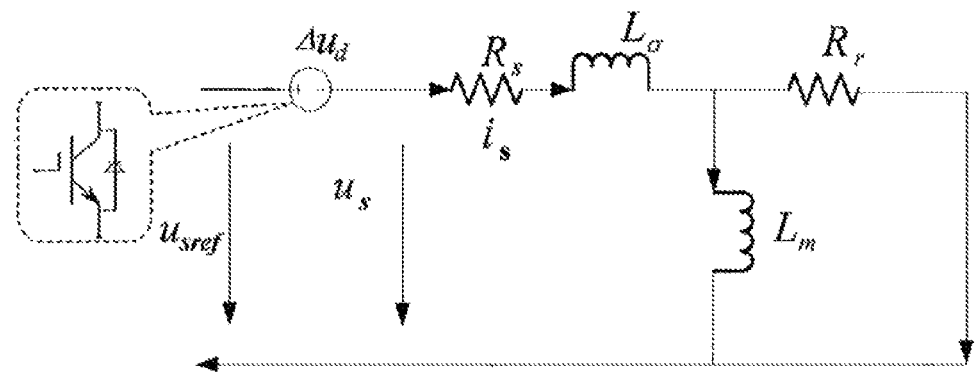
FIG. 10 is a schematic diagram exemplifying the modified circuit of the circuit shown in FIG. 9 according to some aspects.

$u_s$ represents the test phase voltage corresponding to the test phase of the induction motor when the test current $i_s$ is input into the test phase of the induction motor. Taking the second embodiment of apparatus for measuring excitation parameters of the induction motor as an example, the voltage signal of the test phase of the induction motor obtained by the excitation parameter calculating unit is the test phase voltage instruction $u_{sref}$ output by the test phase regulator. There is a voltage error $\Delta u_d$ between the test phase voltage instruction $u_{sref}$ received by the excitation parameter calculating unit and the test phase voltage $u_s$ in test phase of induction motor, which is caused by the device voltage drop and the dead time in the power converter. For taking the effect of these factors into account, the mode of the induction motor shown in FIG. 9 is corrected as an equivalent circuit shown in FIG. 10.

$$\psi'_s = \int(u_{sref} - \Delta u_d - R_s \cdot i_s)dt \quad (2)$$

When calculating the variation of the stator flux linkage $\psi'_s$ according to an equation (2), the following problems will be noted:

The first problem: in view of the voltage error caused by the device voltage drop and the dead time existed in the power converter, and there is a non-linear relationship between the device voltage drop and the test current $i_s$, thus, it is very hard to perform measurement accurately in actual implementations. Therefore, it will probably cause a calculation error when calculating the variation of the stator flux linkage $\psi'_s$ according to the equation (2).

The second problem: being affected by the voltage error caused by the device voltage drop and the dead time, an estimated stator resistance $R'_s$ does not equal the actual stator resistance $R_s$. Therefore, a stator resistance difference $\Delta R_s$ between the estimated stator resistance $R'_s$ and the actual stator resistance $R_s$ will also cause a calculation error when calculating the stator flux linkage.

Figure 11:
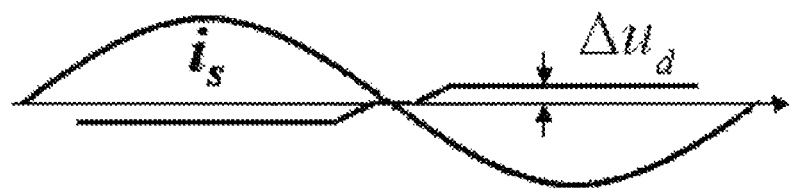
FIG. 11 is a schematic diagram exemplifying the relationship between a current and a voltage error in the circuit shown in FIG. 10 according to some aspects.

For improving accuracy of calculating excitation parameters by the excitation parameter calculating unit, a periodic waveform of the test current may comprise a point-symmetric waveform with respect to a point in a periodic time zone, and the point-symmetric waveform may comprise three waveform segments: a negative direct-current waveform segment, a positive-negative alternating waveform segment, and a positive direct-current waveform segment. Thus, when calculating the stator flux linkage for the test current corresponding to the point-symmetric waveform, in view of a relationship shown in FIG. 11 between the test current $i_s$ with the periodic waveform and the voltage error $\Delta u_d$, and measurements of the test current $i_s$ with the periodic waveform, the stator resistance $R_s$ and the stator resistance difference $\Delta R_s$ corresponding to the point-symmetric waveform with respect to the point in the periodic time zone, there will be the following equations:

$$\int_{-T}^{T} \Delta u_d dt = 0 \quad (3)$$

$$\int_{-T}^{T} (R_s + \Delta R_s) \cdot i_s dt = 0 \quad (4)$$

In the above equations, "T" represents one boundary point of the periodic time zone corresponding to the positive direct-current waveform segment or the negative direct-current waveform segment in the waveform of the test current, and "−T" represents another boundary point of the periodic time zone corresponding to the negative direct-current waveform segment or the positive direct-current waveform segment in the waveform of the test current. Taking a calculated stator flux linkage $\psi_s$ corresponding to the test current $i_s$ of the point-symmetric waveform with respect to one point in the periodic time zone shown in FIG. 12 as example, it will be really robust that calculating the variation of the stator flux linkage $\psi'_s$ may eliminate the effect of the voltage error caused by the dead time and the stator resistance difference by substituting the equations (3) and (4) into the equation (2), thereby to obtain an equation (5):

$$\psi'_s = \int_{-T}^{T} u_{sref} dt = \psi'_s \big|_{t=T} - \psi'_s \big|_{t=-T} = \psi_s - (-\psi_s) = 2 \cdot \psi_s \quad (5)$$

$$\psi_s = \frac{1}{2} \psi'_s = \frac{1}{2} \int_{-T}^{T} u_{sref} dt$$

Therefore, the stator flux linkage $\psi_s$ is a half of an absolute value of the variation of the stator flux linkage $\psi'_s$ corresponding to the waveform from the negative direct-current waveform segment to the positive direct-current waveform segment of the point-symmetric waveform in every period of the test current. There are many kinds of the test currents including the point-symmetric waveform, such as sinusoidal waveform, triangular waveform, and any other periodic test current including the point-symmetric waveform with respect to a point in the periodic time zone.

Figure 12:
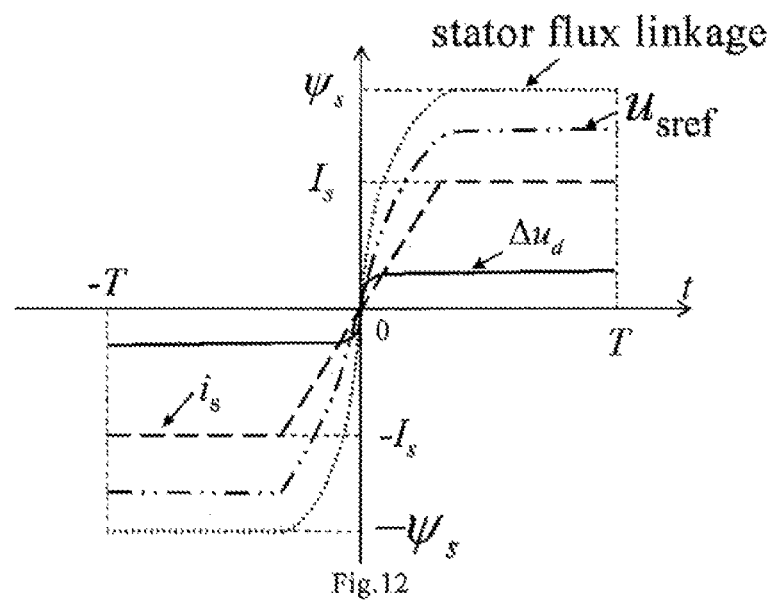
FIG. 12 is a schematic diagram exemplifying a current input into the induction motor according to some aspects.

In order to facilitate to perform sampling and controlling by the apparatus for measuring excitation parameters of the induction motor, the periodic waveform of the test current is a point-symmetric waveform with respect to the midpoint in the periodic time zone, then [−T,T] represents one period of the test current. Further, in order to be convenient for calculating by the excitation parameter calculating unit in the measuring apparatus and to be simple for controlling the test current for the whole measuring apparatus, the periodic waveform of the test current is a point-symmetric trapezoidal waveform with respect to the midpoint in the periodic time zone. A periodic waveform for the test current $i_s$ is shown in FIG. 12, and the magnitude of the test current $i_s$ equals a magnitude of the test current $I_s$ of the positive direct-current waveform segment or an absolute value of a magnitude of the test current $-I_s$ of the negative direct-current waveform segment. The magnitude of the test current $I_s$ approximately equals the magnitude of the excitation current $I_m$.

The stator flux linkage $\psi_s$ corresponding to one period of the test current may be obtained based on an equation (5).

$$\begin{cases} \psi_m = \psi_s - L_\sigma I_s \\ L_m = \psi_m / I_m \end{cases} \quad (6)$$

When the leakage inductance $L_\sigma$ and the excitation current $I_m$ have been known, the air gap flux linkage $\psi_m$ and the excitation inductance $L_m$ can be calculated through the equation (6).

Figure 13:
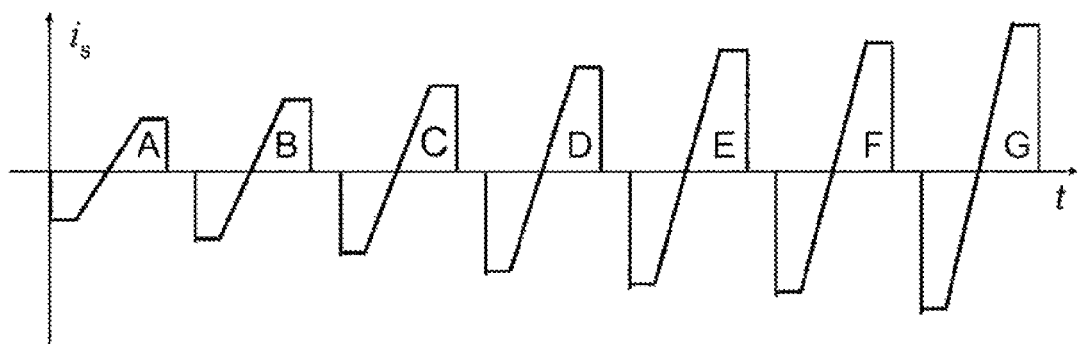
FIG. 13 is a schematic diagram exemplifying an example of the waveform of the test current according to some aspects.
Figure 14:
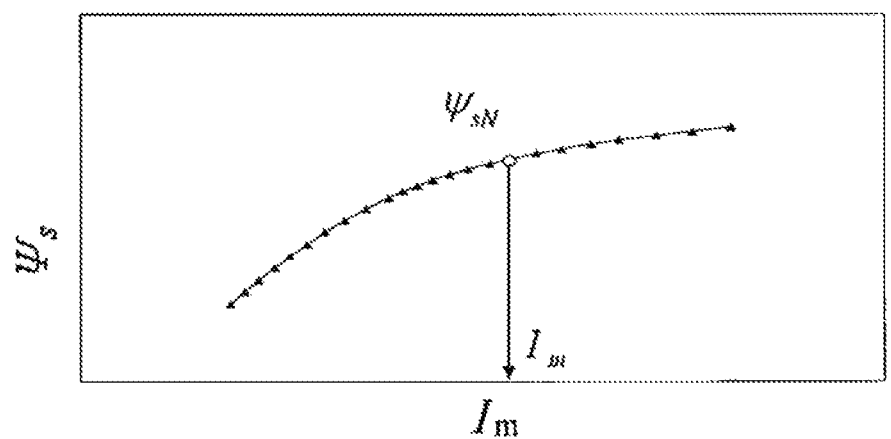
FIG. 14 is a schematic diagram exemplifying a curve of stator flux linkage according to some aspects.

Taking a periodic trapezoidal waveform with different magnitudes (the magnitudes of the test current are from A to G) shown in FIG. 13 as an example of the test current input to the induction motor, based on the voltage of the test phase of the induction motor, the stator flux linkage of the test phase of the induction motor corresponding to the current magnitude for every period of the test current can be calculated, and thus to obtain one group of the stator flux linkages with different excitation levels. As shown in FIG. 14, corresponding to the test current $i_s$ shown in FIG. 13, a curve of various stator flux linkages $\psi_s$ corresponding to different periods of the excitation current $I_m$ can be calculated.

Figure 15:
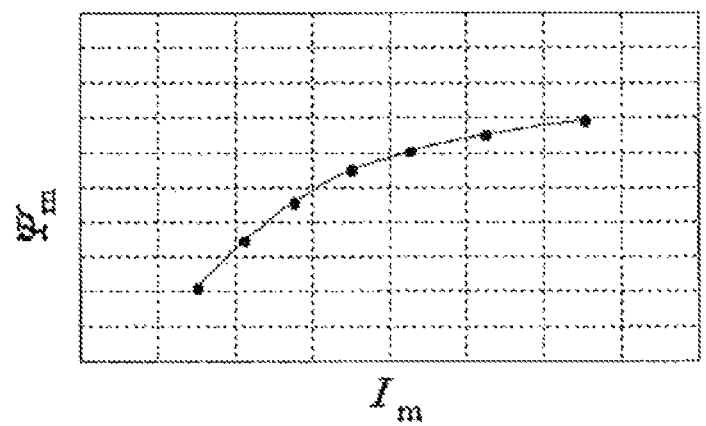
FIG. 15 is a schematic diagram exemplifying a curve of excitation parameters obtained from the example shown in FIG. 13 according to some aspects.

One group of the air gap flux linkages, shown in FIG. 15, of the test phase of the induction motor can be calculated according to the aforesaid equation (6), the magnitudes of the test current, and the stator flux linkages $\psi_s$ corresponding to the magnitudes of the test current, and then, an excitation curve of the air gap flux linkage $\psi_m$ versus the excitation current $I_m$ can be obtained.

Further, in order to measure nominal excitation parameters, an approximate nominal stator flux linkage $\psi_{sN}$ can be calculated based on data shown on a name plate of the tested motor. And then, a nominal excitation current $I_{mN}$ corresponding to the nominal stator flux linkage $\psi_{sN}$ can be calculated by a method of linear interpolation based on the nominal stator flux linkage $\psi_{sN}$ and fitted curve shown in FIG. 14. Given the leakage inductance $L_\sigma$, the approximate nominal air gap flux linkage $\psi_{mN}$ and the nominal excitation inductance $L_{mN}$ can be calculated through the equation (6).

The method for measuring excitation parameters of the induction motor according to the present embodiment can measure excitation parameters of the induction motor in static when the induction motor is connected to the load of the mechanical apparatus, so as to eliminate the errors caused by the device voltage drop and the stator resistance, thereby to conveniently and accurately measure excitation parameters.

A second embodiment of the method for measuring excitation parameters of the induction motor will be described below.

Different from the first embodiment of the method for measuring excitation parameters of the induction motor, other than taking the voltage error caused by the device voltage drop and the dead time of the power converter and the error caused by the stator resistance into account, the present embodiment also takes a DC bias current $i_{dc}$ in the current sampling signal into account, which will also cause an error for measuring excitation parameters of the induction motor.

Figure 16A:
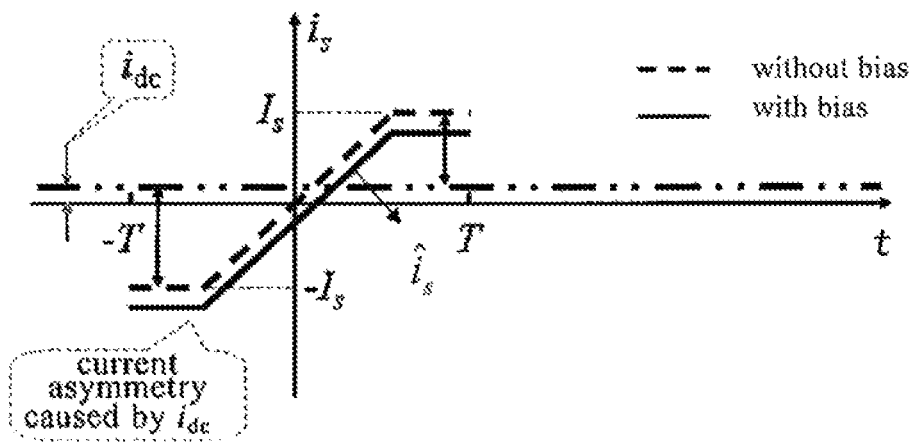
FIGS. 16a, 16b are schematic diagrams exemplifying a voltage influenced by a bias current according to some aspects.
Figure 16B:
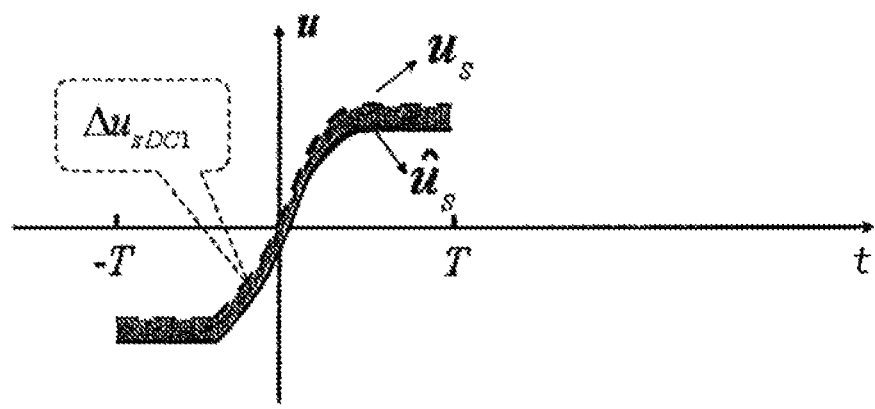

FIG. 16 is illustrated by taking $i_{dc}>0$ as example, and the actual test current and voltage provided into the induction motor are respectively represented by $\hat{i}_s$ and $\hat{u}_s$, as shown in FIG. 16a and FIG. 16b. There will be a voltage error $\Delta u_{sDC1}$ between a control voltage $\hat{u}_s$ with interference from the bias current and an ideal control voltage $u_s$ without interference. The DC bias current will cause the estimated stator flux linkage to deviate from its actual value. Therefore, in order to improve accuracy of measuring excitation parameters, it is desirable to eliminate the error caused by the DC bias current. In the present embodiment, the test current input into the induction motor shall satisfy the following requirements: every periodic waveform of the test current comprises two half-periodic waveforms which are axis-symmetric to each other, and each half-periodic waveform is a point-symmetric waveform with respect to a midpoint of a periodic time zone corresponding to the half-periodic waveform. The half-periodic waveform includes three waveform segments: a negative direct-current waveform segment, a positive-negative alternating waveform segment, and a positive direct-current waveform segment. Taking one single period of waveform for the test current satisfying the above requirements, shown in FIG. 17, as example, the stator flux linkages corresponding to the segments from the negative direct-current waveform segment to the positive direct-current waveform segment of the two point-symmetric half-waveforms in the period for the test current can be respectively calculated, so as to obtain a first stator flux linkage and a second stator flux linkage.

Calculating the first stator flux linkage by integrating the voltage $\hat{u}_s$ in the period $[-T,T]$ shown in FIG. 17 through the equation (5) of the first embodiment of the measuring method, the calculation results will be as follows:

$$\hat{\psi}_{sDC1} = \frac{1}{2}\int_{-T}^{T} \hat{u}_s dt = \frac{1}{2}\int_{-T}^{T} (u_s + \Delta u_{sDC1})dt = \psi_s + \Delta\psi_{sDC1} \quad (7)$$

$$i_{dc} > 0, \text{ and } t \in [-T \quad T] \quad (8)$$

$$\because \Delta u_{sDC1} < 0$$

$$\therefore \Delta\psi_{sDC1} < 0, 0 < \hat{\psi}_{sDC1} < \psi_s$$

Because the half-periodic waveform corresponding to the first stator flux linkage is a point-symmetric waveform with respect to the midpoint in the periodic time zone corresponding to this half-periodic waveform, it can be understood from the first embodiment of the measuring method: calculating result of the first stator flux linkage can eliminate the voltage errors caused by the power converter and the stator resistance, but cannot remove a flux linkage error caused by the DC bias current.

Similarly, calculating the second stator flux linkage by integrating the voltage $\hat{u}_s$ in the period $[T, 3T]$ shown in FIG. 17 through the equation (5) of the first embodiment of the measuring method, the calculation results will be as follows:

$$\hat{\psi}_{sDC2} = \frac{1}{2}\int_{T}^{3T} \hat{u}_s dt = \frac{1}{2}\int_{T}^{3T} (u_s + \Delta u_{sDC2})dt = -\psi_s + \Delta\psi_{sDC2} \quad (9)$$

$$i_{dc} > 0, \text{ and } t \in [T \quad 3T] \quad (10)$$

$$\because \Delta u_{sDC2} < 0$$

$$\therefore \Delta\psi_{sDC2} < 0, \hat{\psi}_{sDC2} < -\psi_s < 0$$

Because the half-periodic waveform corresponding to the second stator flux linkage is a point-symmetric waveform with respect to the midpoint in the corresponding periodic time zone, it can be understood from the first embodiment of the measuring method: calculating result of the second stator flux linkage can eliminate the voltage errors caused by the power converter and the stator resistance, but cannot remove an error of the stator flux linkage caused by the DC bias current.

Because the half periodic waveform of the test current corresponding to the first stator flux linkage is axis-symmetric to the half-periodic waveform of the test current corresponding to the second stator flux linkage, an error of the first stator flux linkage $\Delta\psi_{sDC1}$ equals an error of the second stator flux linkage $\Delta\psi_{sDC2}$. As to the case $i_{dc}<0$, a principle of the error of the stator flux linkage caused by the DC bias current is the same as the principle of the DC bias current for the case $i_{dc}>0$, and the two cases are different only in that the signs of the error of the stator flux linkage are contrary to each other, therefore no more details will be given.

For eliminating the error of the stator flux linkage caused by the DC bias current, a half of an absolute value of the difference between the first stator flux linkage and the second stator flux linkage can be calculated as the stator flux linkage corresponding to the test current in the period. That is, the stator flux linkage can be calculated by an equation (11) below:

$$\psi_s = \frac{\hat{\psi}_{sDC1} - \hat{\psi}_{sDC2}}{2} \quad (11)$$

Figure 17:
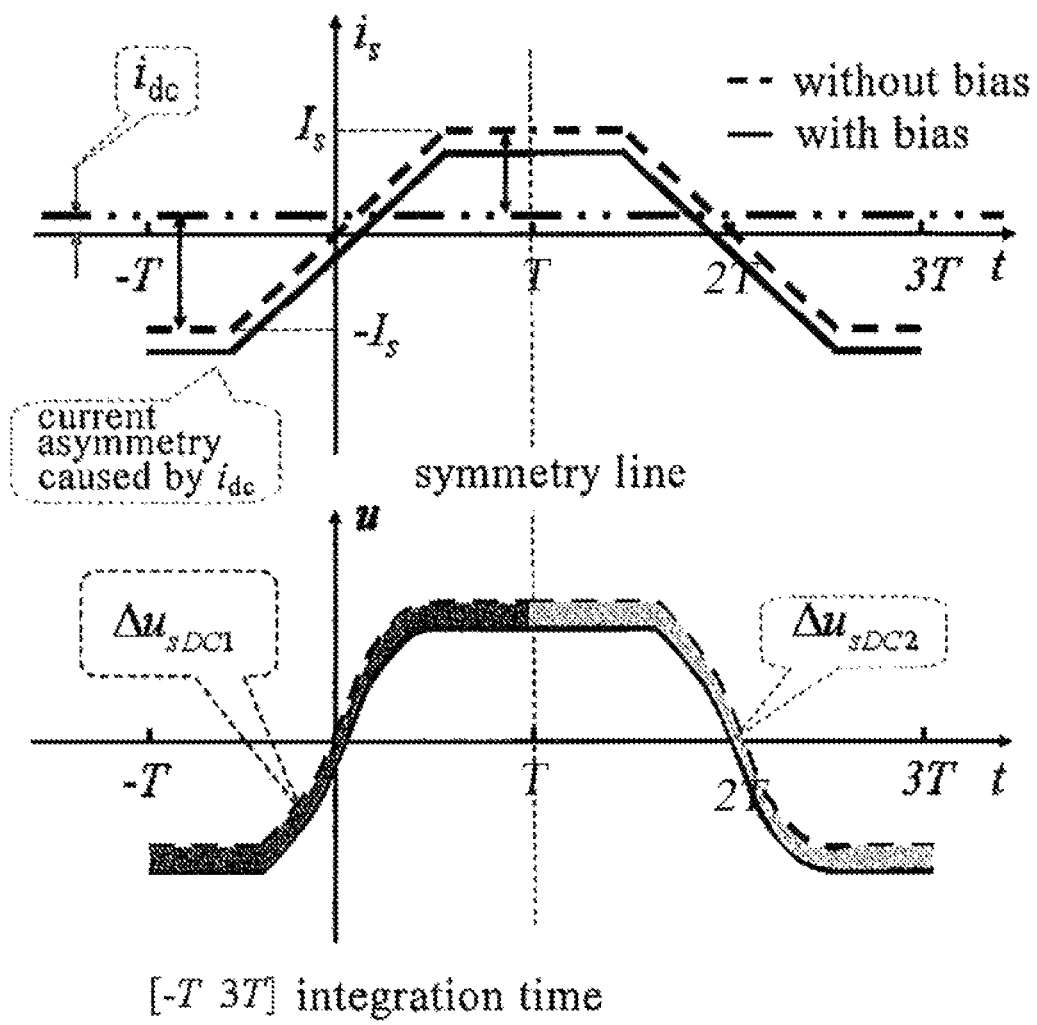
FIG. 17 is a schematic diagram of eliminating the bias current by a symmetric method according to some aspects.
Figure 18A:
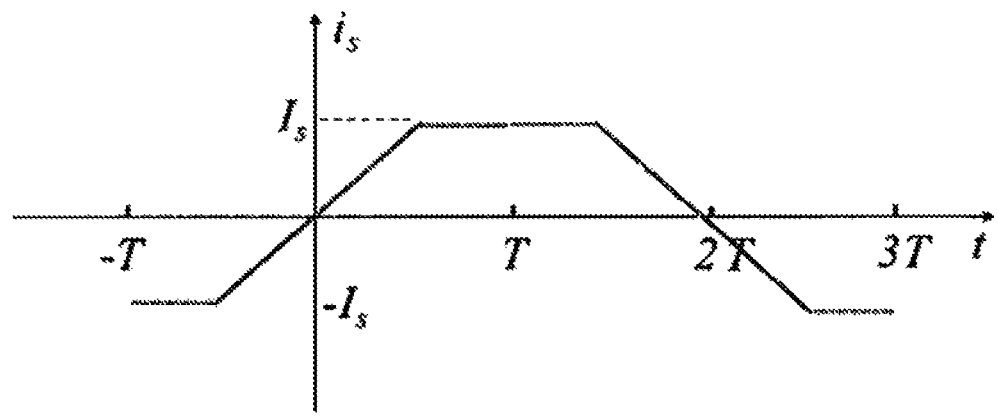
FIGS. 18a, 18b are schematic diagrams exemplifying a waveform of a current according to some aspects.

It can be seen from the process of calculating the stator flux linkage: the periodic waveform of the test current is not limited to the waveform shown in FIG. 17. In order to facilitate to perform sampling and controlling by the apparatus for measuring excitation parameters of the induction motor, one period of waveform for the test current is symmetric waveform with respect to the axis which is perpendicular to time axis and across midpoint of corresponding periodic time zone. In FIG. 17, $[-T, 3T]$ represents one period for the test current. Further, in order to be convenient for calculating by the excitation parameter calculating unit in the measuring apparatus and to be simple for controlling the test current for the whole measuring apparatus, the periodic waveform of the test current is an axis-symmetric waveform with respect to the axis which is perpendicular to time axis and across midpoint of corresponding periodic time zone. If the voltage error caused by the power converter and stator resistance is also required to be eliminated, then each half-periodic waveform is a trapezoidal waveform point-symmetric with respect to the midpoint in the corresponding time zone, as shown in FIG. 18a.

Figure 18B:
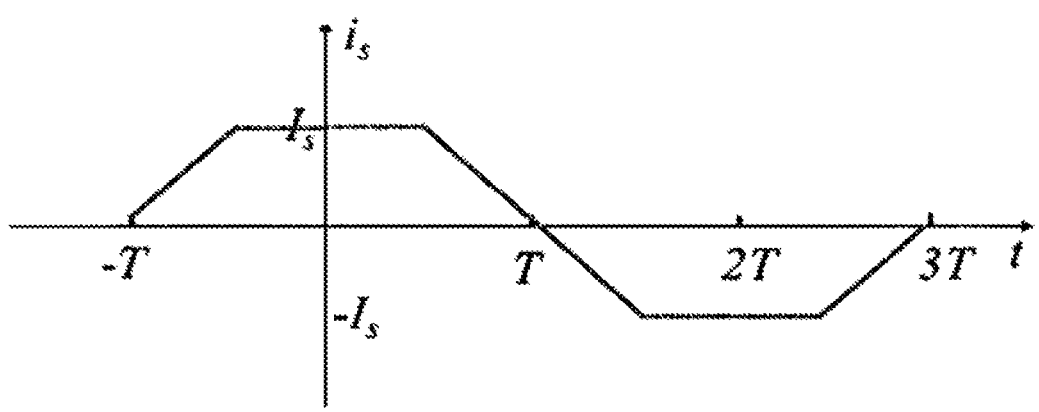

In another way, if the voltage error can be ignored, there is no limit for the shape of half-periodic waveform. The periodic waveform of the test current may also be the waveform shown in FIG. 18b, and in this case, the second stator flux linkage may be the stator flux linkage corresponding to the half-periodic waveform of the test current in a time zone [0, 2T], and the first stator flux linkage may be the stator flux linkage corresponding to the half-periodic waveform of the test current in time zones [−T, 0] and [2T, 3T].

The stator flux linkage corresponding to different magnitudes of the test current can be measured by keeping the waveform of the test current unchanged and varying the magnitudes of the test current in each period. Given that the excitation current approximately equals an effective value of the test current in each period, a relation curve of the stator flux linkage corresponding to various excitation currents can be obtained. Two kinds of test current waveforms illustrated by the FIG. 18 cannot be used to limit the test current waveform. Any test current waveform containing the segment which has feature disclosed above that could eliminate influence caused by the direct current bias through equations (7)-(11) should be embraced within the scope of the invention.

After obtaining the stator flux linkage by calculation, a relation curve of the air gap flux linkage versus the excitation current can be obtained by using the relationship between the air gap flux linkage and the stator flux linkage represented in the equation (6) in the first embodiment of the measuring method.

If it is necessary to obtain the nominal excitation parameters, the same method for calculating nominal excitation parameters as that described in the first embodiment of the measuring method can be adopted, and thus no more details will be given.

When the induction motor is connected to the load of the mechanical apparatus, the method for measuring excitation parameters of the induction motor according to the present embodiment can measure the excitation parameters of the induction motor in static, enable to eliminate the errors caused by the device voltage drop and the stator resistance, or/and to eliminate the error caused by the bias current, thereby to more accurately measure the excitation parameters.

Though the present application has been described by referring to typical embodiments, it should be understood that the terms used are only illustrative and exemplary, but not limitative terms. Understood by those skilled in the art, as the present applicant can be implemented in many forms without departing from the spirit or the substance of the present invention, the above embodiments are not limited to any aforesaid detail, but shall be broadly explained within the spirit and scope defined by the appended claims. Thus, all the changes and modifications which fall into the scope of the claims or the equivalents intend to be covered by the appended claims.

What is claimed is:

1. An apparatus for measuring excitation parameters of an induction motor, comprising: a control unit, a power converter, and an excitation parameter calculating unit, wherein:
    the power converter is for providing a test current to a test phase of the induction motor, and an output of the power converter maintains the induction motor static;
    the control unit is equipped with a current instruction for indicating the test current, and the control unit is for regulating the test current provided by the power converter to be equivalent to the current instruction, meanwhile controlling the output of the power converter to maintain the induction motor static; and
    the excitation parameter calculating unit is for receiving a voltage signal of a test phase of the induction motor and a current signal of the test phase of the induction motor to calculate the excitation parameters.

2. The apparatus according to claim 1, wherein the control unit comprises:
    a comparator, equipped with the current instruction, and for receiving a sample signal of the test current and comparing the sample signal with the current instruction to output an error of the current signal; and
    a regulator, for receiving the error of the current signal, regulating the test current provided by the power converter to be equivalent to the current instruction, and controlling the output of the power converter to maintain the induction motor static.

3. The apparatus according to claim 2, wherein the regulator comprises: a test phase regulator and a signal converter, wherein:
    the test phase regulator is for receiving the error of the current signal, and outputting a test phase voltage instruction for indicating a test phase voltage output by the power converter; and
    the signal converter is for receiving the test phase voltage instruction, controlling the test phase voltage provided by the power converter to be equivalent to the test phase voltage instruction, and meanwhile controlling the output of the power converter to maintain the induction motor static.

4. The apparatus according to claim 3, wherein the voltage signal of the test phase received by the excitation parameter calculating unit is the test phase voltage instruction.

5. The apparatus according to claim 1, wherein the current signal of the test phase received by the excitation parameter calculating unit is a sample signal of the test current.

6. The apparatus according to claim 1, wherein the current signal of the test phase received by the excitation parameter calculating unit is the current instruction.

7. The apparatus according to claim 1, wherein the voltage signal of the test phase received by the excitation parameter calculating unit is a sample signal of a test phase voltage of the induction motor.

8. The apparatus according to claim 1, wherein the output of the power converter maintains the induction motor static by the following settings:
    the test current or the test phase voltage provided by the power converter to the test phase of the induction motor equals a sum of magnitudes of currents or voltages provided to another two non-test phases of the induction motor, and a direction of the test current or the test phase voltage is opposite to a direction of the currents or the voltages provided to the two non-test phases; or
    the test current or the test phase voltage provided by the power converter to the test phase of the induction motor equals a magnitude of a current or a voltage provided to one non-test phase of the induction motor, and a direction of the test current or the test phase voltage is opposite to a direction of the current or the voltage provided to said one non-test phase, and another non-test phase of the induction motor is electrically disconnected from the power converter or none of current or voltage is provided by the power converter to said another non-test phase of the induction motor.

9. The apparatus according to claim 1, wherein the current instruction is a single periodic current instruction or a periodic current instruction with different current magnitude for each period.

10. The apparatus according to claim 9, wherein a periodic waveform of the current instruction comprises a point-symmetric waveform with respect to a point in corresponding periodic time zone, and the point-symmetric waveform comprises three waveform segments: a negative direct-current waveform segment, a positive-negative alternating waveform segment, and a positive direct-current waveform segment.

11. The apparatus according to claim 10, wherein the periodic waveform of the current instruction is a point-symmetric trapezoidal waveform with respect to a midpoint in corresponding periodic time zone.

12. The apparatus according to claim 10, wherein the periodic waveform of the current instruction comprises two half waveform segments axis-symmetric to each other, and each half waveform segment is a point-symmetric waveform with respect to a midpoint in the periodic time zone corresponding to the half waveform segment.

13. The apparatus according to claim 12, wherein the periodic waveform of the current instruction consists of two half-periodic waveform segments which are axis-symmetric to each other, and each half-periodic waveform segment is a point-symmetric trapezoidal waveform with respect to the midpoint in the periodic time zone corresponding to the half-periodic waveform segment.

14. The apparatus according to claim 9, wherein the excitation parameter calculating unit calculates one or multiple groups of excitation parameters of the test phase of the induction motor corresponding to a magnitude or magnitudes of the current instruction.

15. A method for measuring excitation parameters of an induction motor, comprising:
maintaining the induction motor static, and inputting a test current to a test phase of the induction motor; and
calculating, performed by an excitation parameter calculating unit, based on a voltage of the test phase of the induction motor, a stator flux linkage of the test phase of the induction motor corresponding to a magnitude of the test current;
wherein maintaining the induction motor static comprises controlling a magnitude and a direction of volts voltage or current provided to the test phase and non-test phases of the induction motor, in which:
the test current or the voltage provided by a power converter to the test phase of the induction motor respectively equals a sum of the magnitudes of currents or the magnitudes of voltages provided to another two non-test phases of the induction motor, and the direction of the test current or the voltage is opposite to a direction of currents or voltages provided to the two non-test phases; or
the test current or the voltage provided by the power converter to the test phase of the induction motor respectively equals the magnitude of current or the magnitude of voltage provided to one non-test phase of the induction motor, and the direction of the test current or the voltage is opposite to the direction of current or voltage provided to said one non-test phase, and another non-test phase of the induction motor is electrically disconnected from the power converter or none of current or voltage is provided by the power converter to said another non-test phase of the induction motor.

16. The method according to claim 15, wherein the test current is a single periodic test current or a periodic test current with the magnitude varying.

17. The method according to claim 16, wherein a periodic waveform of the test current comprises a point-symmetric waveform with respect to a point in a periodic time zone, and the point-symmetric waveform comprises three waveform segments: a negative direct-current waveform segment, a positive-negative alternating waveform segment, and a positive direct-current waveform segment.

18. The method according to claim 17, wherein the magnitude of the test current equals a magnitude of the positive direct-current waveform segment or an absolute value of a magnitude of the negative direct-current waveform segment, and the magnitude of the test current approximately equals a magnitude of an excitation current.

19. The method according to claim 18, wherein obtaining, based on the voltage of the test phase of the induction motor corresponding to the magnitude of the test current, the stator flux linkage corresponding to the magnitude of the excitation current or a curve of the stator flux linkage corresponding to different magnitudes of the excitation current.

20. The method according to claim 19, wherein, calculating, based on the stator flux linkage and corresponding magnitude of the excitation current, an air gap flux linkage; or calculating, based on the curve of the stator flux linkage corresponding to different magnitudes of the excitation current, a curve of the air gap flux linkage corresponding to different magnitudes of the excitation current.

21. The method according to claim 19, wherein obtaining, based on the curve of the stator flux linkage and a nominal stator flux linkage, a nominal excitation current corresponding to the nominal stator flux linkage.

22. The method according to claim 21, wherein obtaining, based on the nominal stator flux linkage and the nominal excitation current, a nominal air gap flux linkage and a nominal excitation inductance.

23. The method according to claim 17, wherein the periodic waveform of the test current is a point-symmetric trapezoidal waveform with respect to a midpoint in the periodic time zone.

24. The method according to claim 17, wherein the calculated stator flux linkage is a half of an absolute value of a variation of the stator flux linkage ranged from the negative direct-current waveform segment to the positive direct-current waveform segment of the point-symmetric waveform in each period of the test current.

25. The method according to claim 17, wherein each periodic waveform of the test current comprises two half waveform segments which are axis-symmetric to each other, and each half waveform segment is a point-symmetric waveform with respect to a point in the periodic time zone corresponding to the half waveform segment.

26. The method according to claim 25, wherein the periodic waveform of the test current consists of two half-periodic waveform segments which are axis-symmetric to each other, and each half-periodic waveform segment is a point-symmetric trapezoidal waveform with respect to a midpoint in the periodic time zone corresponding to the half-periodic waveform segment.

27. The method according to claim 25, wherein calculating the stator flux linkage corresponding to a single period of the test current comprises:
calculating the stator flux linkage respectively corresponding to the two half waveform segments to obtain a first stator flux linkage and a second stator flux linkage in the period of the test current; and calculating a half of the absolute value of difference value between the first stator flux linkage and the second stator flux linkage as the stator flux linkage in the period of the test current.

\* \* \* \* \*